(12) United States Patent
Glickman

(10) Patent No.: US 9,565,748 B2
(45) Date of Patent: Feb. 7, 2017

(54) NANO-COPPER SOLDER FOR FILLING THERMAL VIAS

(71) Applicant: Flextronics AP, LLC, Broomfield, CO (US)

(72) Inventor: Michael James Glickman, Mountain View, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/524,894

(22) Filed: Oct. 27, 2014

(65) Prior Publication Data

US 2015/0114707 A1    Apr. 30, 2015

Related U.S. Application Data

(60) Provisional application No. 61/896,592, filed on Oct. 28, 2013.

(51) Int. Cl.
| | |
|---|---|
| H05K 1/03 | (2006.01) |
| H05K 1/00 | (2006.01) |
| H05K 1/09 | (2006.01) |
| H05K 1/11 | (2006.01) |
| H05K 1/02 | (2006.01) |
| H05K 3/00 | (2006.01) |

(52) U.S. Cl.
CPC .......... *H05K 1/0206* (2013.01); *H05K 3/0094* (2013.01); *H05K 2201/0257* (2013.01); *H05K 2201/0266* (2013.01)

(58) Field of Classification Search
CPC ................ H05K 1/0206; H05K 3/0094; H05K 2201/0257; H05K 2201/0266

USPC ................................ 174/256, 257, 262, 252
See application file for complete search history.

(56) References Cited

U.S. PATENT DOCUMENTS

| | | | |
|---|---|---|---|
| 4,069,497 A | 1/1978 | Steidlitz | |
| 4,712,160 A | 12/1987 | Sato et al. | |
| 4,899,256 A | 2/1990 | Sway-Tin | |
| 5,101,322 A | 3/1992 | Ghaem et al. | |
| 5,235,491 A | 8/1993 | Weiss | |
| 5,272,599 A | 12/1993 | Koenen | |
| 5,295,044 A | 3/1994 | Araki et al. | |
| 5,365,403 A | 11/1994 | Vinciarelli et al. | |
| 5,536,677 A | 7/1996 | Hutbacher | |
| 5,739,586 A * | 4/1998 | Cannizzaro | H01L 23/3677 257/706 |

(Continued)

OTHER PUBLICATIONS

Non-final office action dated Aug. 11, 2016, U.S. Appl. No. 14/476,549, filed Sep. 3, 2014, 9 pages.

*Primary Examiner* — Sherman Ng
(74) *Attorney, Agent, or Firm* — Haverstock & Owens LLP

(57) ABSTRACT

A method of and device for forming vias on an electronic board (such as a PCB board) comprises forming one or more holes on the electronic board, placing a nanomaterial inside the one or more holes, and forming one or more filled holes on the electronic board. The nanomaterial can be nanocopper, which can be either push/pull into the holes on the electronic board or a combination of push and pull. The push/pull can be performed by using a mechanical device or by a person. A capping layer can be on both side of the via. The vias formed by using the nanomaterials provides a high efficient vertical heat transferring path from one side of the electronic board to the other side of the electronic board.

22 Claims, 4 Drawing Sheets

(56) References Cited

U.S. PATENT DOCUMENTS

| | | |
|---|---|---|
| 5,838,554 A | 11/1998 | Lanni |
| 5,872,051 A | 2/1999 | Fallon et al. |
| 5,873,512 A | 2/1999 | Bielick et al. |
| 5,879,738 A | 3/1999 | McKinnon |
| 5,920,458 A | 7/1999 | Azar |
| 5,933,324 A | 8/1999 | Barrett |
| 5,974,576 A | 10/1999 | Zhu |
| 6,168,972 B1 | 1/2001 | Wang |
| 6,189,771 B1 | 2/2001 | Maeda et al. |
| 6,202,181 B1 | 3/2001 | Ferguson et al. |
| 6,243,269 B1 | 6/2001 | Dibene, II et al. |
| 6,245,595 B1 | 6/2001 | Nguyen et al. |
| 6,272,015 B1 | 8/2001 | Mangtani |
| 6,282,092 B1 | 8/2001 | Okamoto et al. |
| 6,311,139 B1 | 10/2001 | Kuroda et al. |
| 6,369,328 B1 | 4/2002 | Munakata |
| 6,400,573 B1 | 6/2002 | Mowatt |
| 6,477,054 B1 * | 11/2002 | Hagerup ............. H01L 23/3677 174/262 |
| 6,549,409 B1 | 4/2003 | Saxelby et al. |
| 6,560,736 B2 | 5/2003 | Ferguson et al. |
| 6,775,162 B2 | 8/2004 | Mihai et al. |
| 6,795,315 B1 | 9/2004 | Wu et al. |
| 7,036,059 B1 | 4/2006 | Carmichael et al. |
| 7,208,833 B2 | 4/2007 | Nobori et al. |
| 7,225,368 B2 | 5/2007 | Lancaster |
| 7,269,017 B2 * | 9/2007 | Berlin ............... H01L 23/3677 165/185 |
| 7,324,924 B2 | 1/2008 | Barajas et al. |
| 7,337,537 B1 | 3/2008 | Smetana, Jr. |
| 7,409,594 B2 | 8/2008 | Mukherjee et al. |
| 7,529,631 B2 | 5/2009 | Matsushita et al. |
| 7,676,775 B2 | 3/2010 | Chen et al. |
| 8,161,428 B2 | 4/2012 | Yokogawa |
| 8,330,051 B2 | 12/2012 | Huang |
| 8,707,221 B2 | 4/2014 | Durkan |
| 2001/0003427 A1 | 6/2001 | Ferguson et al. |
| 2001/0018263 A1 | 8/2001 | Ochiai et al. |
| 2002/0008963 A1 | 1/2002 | DiBene, II et al. |
| 2002/0053065 A1 | 5/2002 | Mitsutake et al. |
| 2002/0092160 A1 | 7/2002 | McCullough |
| 2004/0000425 A1 * | 1/2004 | White ................. H01L 21/4857 174/250 |
| 2004/0122606 A1 | 6/2004 | Cohen et al. |
| 2004/0144527 A1 | 7/2004 | Yang et al. |
| 2005/0097481 A1 | 5/2005 | Mitsutake et al. |
| 2005/0246590 A1 | 11/2005 | Lancaster |
| 2006/0196642 A1 | 9/2006 | Gharib |
| 2007/0074391 A1 * | 4/2007 | Totokawa ............. H05K 1/097 29/846 |
| 2007/0179753 A1 | 8/2007 | Barajas et al. |
| 2007/0198548 A1 | 8/2007 | Lee |
| 2007/0221404 A1 * | 9/2007 | Das ................. H05K 3/462 174/264 |
| 2007/0272435 A1 | 11/2007 | Johnson |
| 2007/0273011 A1 | 11/2007 | Singleton et al. |
| 2008/0004823 A1 | 1/2008 | Matsushita et al. |
| 2008/0034258 A1 | 2/2008 | Moriya et al. |
| 2008/0070011 A1 * | 3/2008 | Oh ................. H05K 3/4053 428/208 |
| 2008/0140330 A1 | 6/2008 | Morioka et al. |
| 2008/0157322 A1 | 7/2008 | Tang |
| 2008/0157324 A1 | 7/2008 | Tang |
| 2008/0186682 A1 * | 8/2008 | Sugimura ............. H05K 1/0206 361/720 |
| 2008/0217768 A1 | 9/2008 | Miranda et al. |
| 2008/0224026 A1 | 9/2008 | Pasternak |
| 2008/0277154 A1 | 11/2008 | Buchwalter |
| 2008/0301597 A1 | 12/2008 | Chen et al. |
| 2009/0014501 A1 | 1/2009 | Nishi et al. |
| 2009/0083975 A1 * | 4/2009 | Lee ................. B82Y 10/00 29/830 |
| 2009/0220738 A1 * | 9/2009 | Oka ................. H01B 1/22 428/137 |
| 2009/0265155 A1 | 10/2009 | Yokogawa |
| 2009/0301606 A1 * | 12/2009 | Ueshima ............. B23K 35/0244 148/24 |
| 2010/0025091 A1 * | 2/2010 | Ferdinandi ............. H05K 3/282 174/257 |
| 2011/0225816 A1 | 9/2011 | Chou |
| 2011/0290540 A1 | 12/2011 | Jung |
| 2011/0307752 A1 | 12/2011 | Fuji et al. |
| 2012/0024575 A1 | 2/2012 | Zhang |
| 2012/0063096 A1 | 3/2012 | Kearney |
| 2012/0104591 A1 | 5/2012 | Warren |
| 2013/0174110 A1 | 7/2013 | Durkan |
| 2013/0209672 A1 * | 8/2013 | Reinmuth ............. H05K 3/4061 427/97.8 |
| 2014/0085579 A1 | 3/2014 | Fan |

* cited by examiner

NANO-COPPER SOLDER FOR FILLING THERMAL VIAS

CROSS-REFERENCE TO RELATED APPLICATION(S)

This application claims priority under 35 U.S.C. §119(e) of the U.S. Provisional Patent Application Ser. No. 61/896,592, filed Oct. 28, 2013 and titled, "NANO-COPPER SOLDER FOR FILLING THERMAL VIAS," is also hereby incorporated by reference in its entirety for all purposes.

FIELD OF THE INVENTION

The present invention relates to a thermal management methods and constructions for electronic circuits. More specifically, the present invention relates to through-hole vias filling in printed circuit boards.

BACKGROUND OF THE INVENTION

Typically, an array of plated through-hole vias is drilled and plated to thermally transfer heat from one side of the PCB to the other side of the PCB in a z-axis direction. However, it is time consuming and often unreliable to plate copper to a thickness greater than a small percentage of the via hole. For this reason, thermally conductive epoxy fillers are typically placed in the via holes. Nonetheless, thermally conductive epoxy filler typically makes a negligible contribution to the overall thermal conductivity because its thermal conductivity is substantially less than copper. Filling the via holes with traditional solder not only has much lower thermal conductivity than a copper material, but also can flow out during subsequent thermal processing.

SUMMARY OF THE INVENTION

In some embodiments, a nano-copper solder comprises dispersed copper nanoparticles in a solvent. The nano-copper solder melts at around 200° C., which is far below the 1085° C. melting point of bulk copper. Methods of using the nano-copper solder to fill through holes are also disclosed. In some embodiments of the present invention, the nano-copper solder is used to fill a thermal plated-through-hole via, such that the thermal conductivity of these vias is improved, which facilitates the heat dissipation or conduction.

In some embodiments, the nano-copper solder disclosed herein has a high thermal conductivity, so that it can greatly increase the overall thermal conductivity of the vias. In addition, the melting point of the nano-copper solder (after a solder reflowing process) prevents outflow during subsequent lead-free solder reflowing cycles. In some embodiments, the nano-copper solder comprises different sizes/mixed sizes particles (such as, a bell curve distribution of sizes; such as 1-10 nm), such that the nano-copper solder has a high particle packing density, which is greater than the packing density of particles with only a single uniform size. In some embodiments, the solvent for the nano-copper solder is a volatile organic solvent, such as hexane, methanol, isopropanol, and acetone. In some embodiments, the solvent of the nano-copper solder is an inorganic solvent, such as an ionic liquid.

In some embodiments, the nano-copper solder is pushed into the via holes by using a stencil printer and/or an optional vacuum table. In other embodiments, the nano-copper solder is pushed/placed into the via holes by hand or mechanically with a machine. In some other embodiments, the nano-copper solder is pushed into the via holes by using a squeegee and/or with a vacuum table. Any other methods and devices that push the materials (e.g., the nano-copper solder) from one side of the via hole on the PCB and/or pull materials from the opposite side of the via hole are within the scope of the present invention. In some embodiments, a capping layer (e.g., electroplated copper) is applied before or after a solder reflowing process.

In an aspect, a method of forming filled holes on an electronic board comprises forming one or more holes on the electronic board, placing a nanomaterial inside the one or more holes, and forming one or more filled holes on the electronic board. In some embodiments, the electronic board comprises a printed circuit board. In other embodiments, the nanomaterial comprises nanocopper. In some other embodiments, the one or more holes comprise a through hole. In some embodiments, the method further comprises plating a metal on the one or more holes. In some embodiments, the method further comprises a reflowing process. In other embodiments, the method further comprises evaporating a solvent. In some other embodiments, the solvent comprises an alcohol. In some embodiments, the placing comprises pushing in the nanomaterial. In other embodiments, the pushing comprises using a sequeegee. In some other embodiments, the placing comprises using a stencil printer. In other embodiments, the placing comprises pulling in the nanomaterial. In some other embodiments, the pulling comprising using a vacuum table.

In another aspect, an electronic board comprises a nano-particles filled via. In some embodiments, the via comprises a body having nanoparticles throughout the body. In other embodiments, the nanoparticles comprise mixed sizes nanoparticles. In some other embodiments, the via is enclosed by a capping layer.

In another aspect, a method of filling a plated through-hole comprises forming a via hole on a PCB board, cleaning the via hole by using a chemical solution or plasma, forming a layer of metal coating on an outer surface of the via hole, placing a nanomaterial solder into the via hole, and performing a reflowing process. In some embodiments, the via hole is formed by using a mechanical or a laser drill. In other embodiments, forming the layer of metal coating uses an electroless copper plating solution. In some other embodiments, the method further comprises electroplating copper into the via hole. In some embodiments, the nanomaterial solder comprises a nanocopper solder. In other embodiments, the placing comprises pushing. In some other embodiments, the placing comprises pulling. In some embodiments, the reflowing comprises sending the PCB board through a lead-free solder reflow oven to melt or fuse the nanomaterial solder.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals are vary from one implementation to another and from one developer to another. Moreover, it is appreciated that such a development effort can be complex and time-consuming, but is nevertheless a routine undertaking of engineering for those of ordinary skill in the art having the benefit of this disclosure.

The methods and devices disclosed herein can be used to make heat dissipating structures, such as one or more vias on a PCB (printed circuit board).

Figure 1:
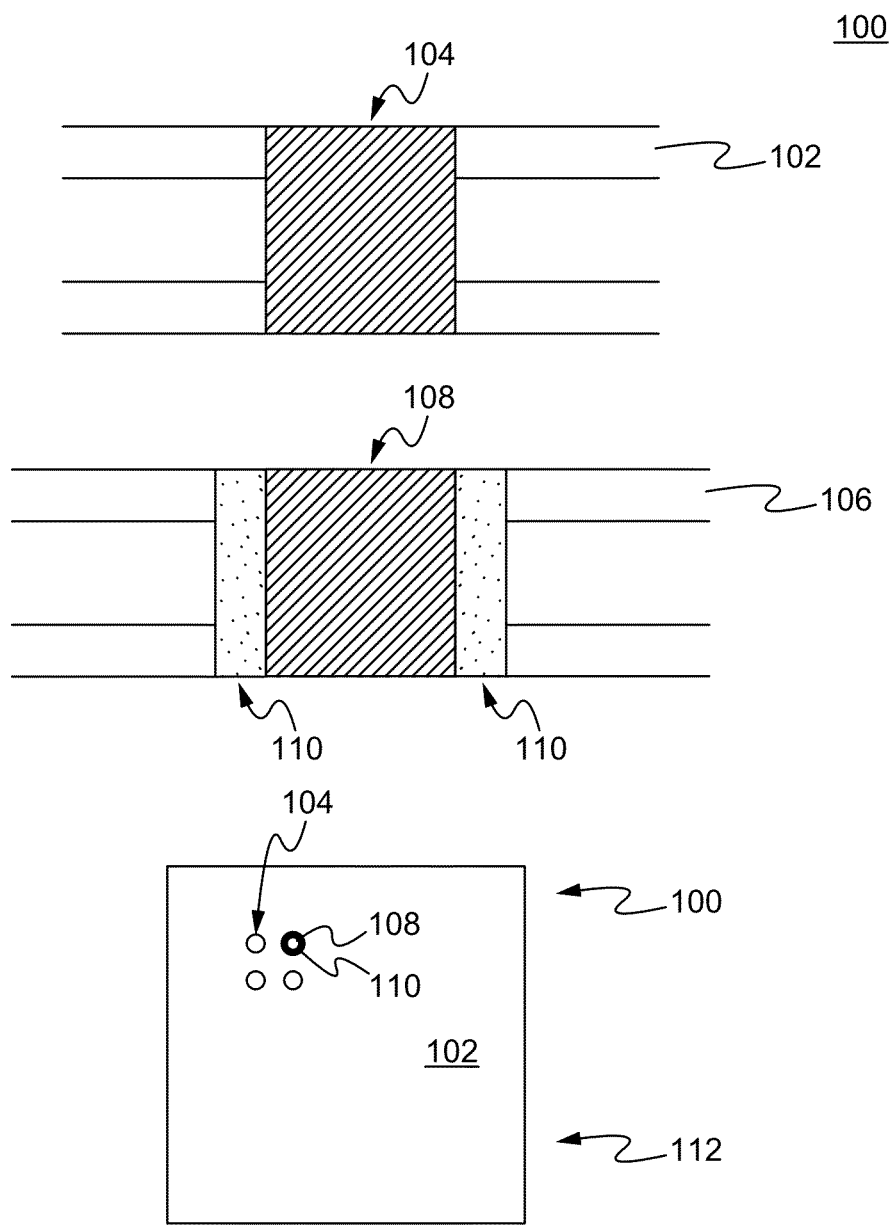
FIG. 1 illustrates a nanomaterial filled PCB board in accordance with some embodiments of the present invention.

FIG. 1 illustrates a nanomaterial filled PCB board 100 in accordance with some embodiments of the present invention. In some embodiments, the PCB 100 comprises a body 102. The body 102 comprises one or more nanoparticle filled vias 104. In other embodiments, the PCB 106 comprises one or more nanoparticle filled vias 108 with plated walls 110. The view 112 illustrates a top view of the PCB board 100, the body 102, vias 104 and 108, and plated walls 110 in accordance with some embodiments. In some embodiments, the vias 104 and 108 comprise nano-copper solder. In some embodiments, the walls 110 comprise electroplated copper.

Figure 2:
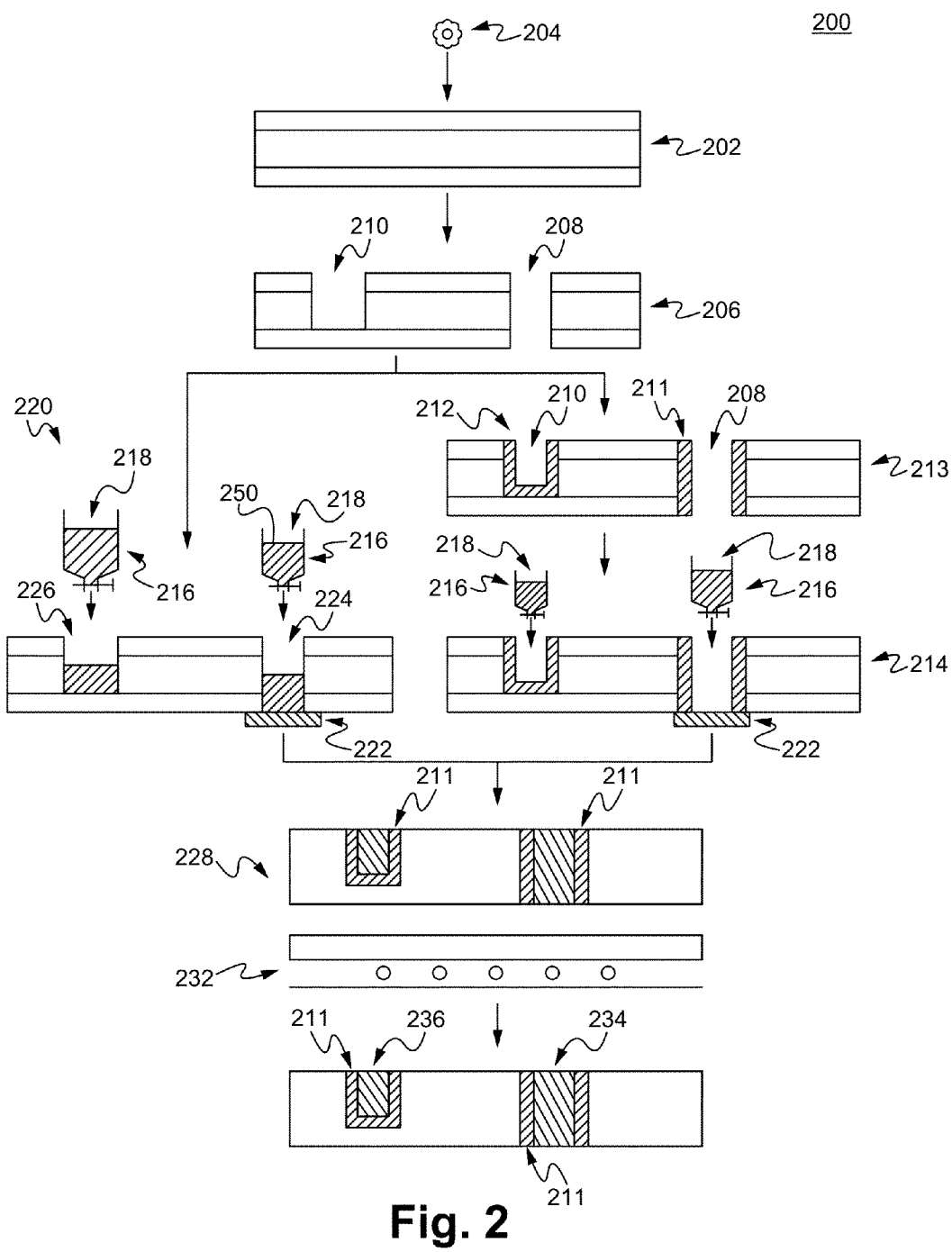
FIG. 2 illustrates a nanomaterial filled PCB manufacturing method in accordance with some embodiments of the present invention.

FIG. 2 illustrates a nanomaterial filled PCB manufacturing method 200 in accordance with some embodiments of the present invention. At Step 202, one or more holes or apertures are formed on the body 202 of the PCB, which forms a drilled PCB 206. In some embodiments, the holes are through-holes 208. In some other embodiments, the holes are recesses 210 (non-through holes). A person of ordinary skill in the art appreciates that any shape, depth, angle, or geometry of the holes are formed on the body 202 of the PCB 200. The formation of the holes can be performed using mechanical drilling, etching, or laser cutting, straight or at an angle. For example, a recess that poses a tilted 45 degree angle from the top surface of the body 202 can be formed. A person of ordinary skill in the art appreciates that any other cutting or drilling devices and methods can be used to form the holes and/or recess. The drilled PCB 206 can be sent to a plating process at Step 213 to form plated walls 211 and 212 on the holes 208 and 210 before filling the holes with a nanomaterial. In an alternative process, the drilled PCB 206 is directly sent to a nanomaterial filling process 220 without plating the walls.

The Steps 220 and 214 comprise dispensing a solution having one or more types of nanomaterials into the holes 208, 210, 224, and 226. In some embodiments, the solution is dispensed using a dropper 216 containing a nanomaterial dispersed solution 218. In some embodiments, the nanomaterial comprises copper nanoparticles 250. A person of ordinary skill in the art appreciates that any other nanomaterials, nanoparticles, quantum dots, nanometallic materials are within the scope of the present invention. The dropper 216 can pushed the solution into one ore more of the holes 208 and 210. A blocker 222 can be placed underneath the body 202 to prevent the leakage of the filled nanomaterials.

At the Step 228, the body 202 is heated using a heater 232. The heating evaporates the solvent, such that the nanoparticles (such as, the nano-copper solder particles) inside the holes fuse with each other and fuse with the plated copper 211 on the via barrel forming the filled nanomaterials 234 and 236.

Figure 3:
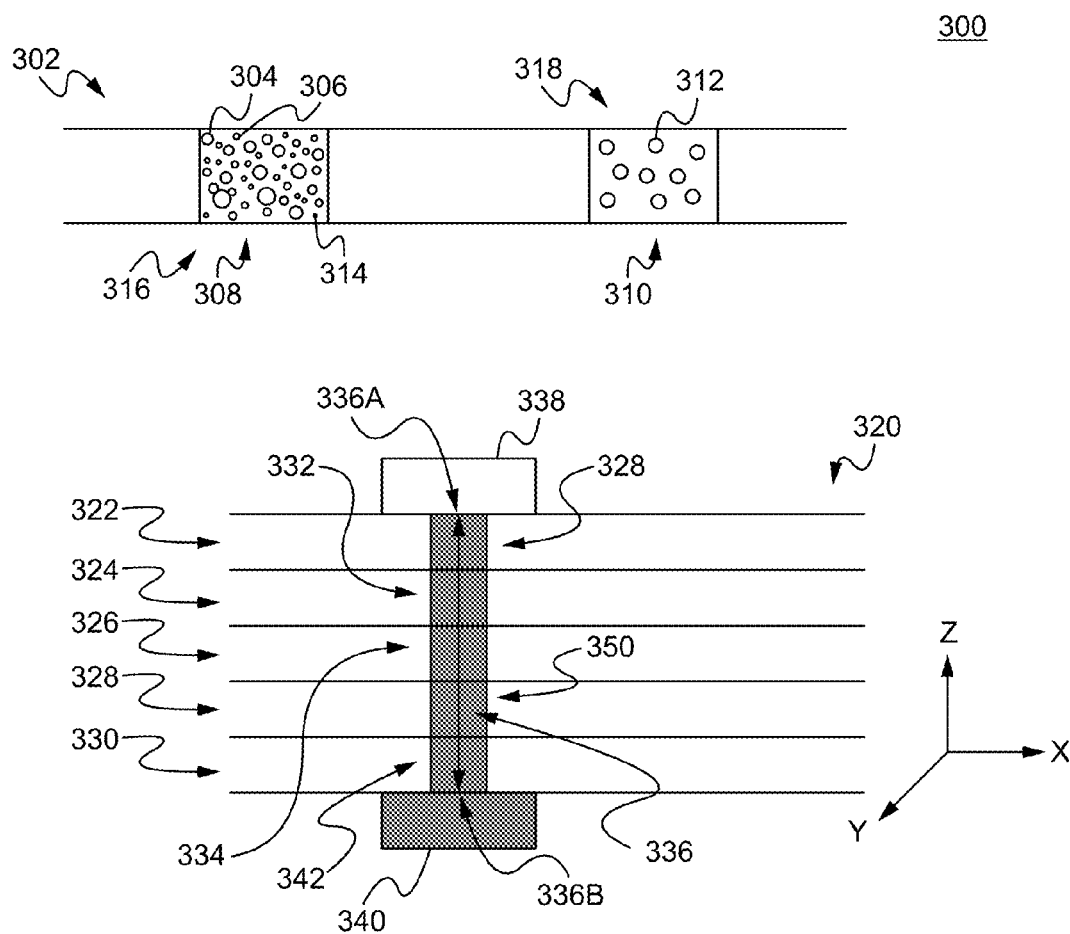
FIG. 3 illustrates a PCB in accordance with some embodiments of the present invention.

FIG. 3 illustrates a PCB 300 in accordance with some embodiments of the present invention. The PCB 300 comprises a body 302 having a nanomaterial solder filled holes 308 and 310. The nanomaterials in the hole 308 comprises large size nanoparticles 304, middle size nanoparticles 306, and fine powder size nanoparticles 314 forming a mixed sized nanoparticles filled via 316. In some embodiments, the large size nanoparticles 304 have a diameter from 10 nm-100 nm. In some embodiments, the middle size nanoparticles 306 have a diameter from 2 nm-10 nm. In some embodiments, the fine powder size nanoparticles 314 have a diameter 1 nm or below. In some embodiments, the nanomaterials in the hole 310 comprises a single size nanoparticles 312. In some embodiments, the single size refers to nanoparticles have a size distribution within a small range, such as 0.5 nm.

In some embodiments, a PCB has a body 320 with plurality of layers (e.g., 322, 324, 326, 328, and 330), such as 42 layers, laminated together with vias 328, 332, 334, 350, and 342 in each layer capable of conducting/dissipating heat from the surface 336A of first top layer 322 of the laminate to the bottom surface 336B of the bottom layer 330 forming a heat conducting path 336 in a z-axis direction, which is substantially perpendicular to the body (x-y plane) of the PCB. The heat path 336 conducts heat generated at the heat generating device 338 (e.g., CPU) to the heat sink 340.

The PCB disclosed herein can be used in base-stations, routers, cell phones, watches, power amplifiers, and any other electronic components that generate/emit heat. In some embodiments, the methods and devices disclosed herein can be used to conduct/remove heat away from an embedded coin, such as a copper coin, on the PCB. In some embodiments, a PCB contains an embedded coin in the $1^{st}$-$4^{th}$ layers of the laminate and a group of vias are strategically placed at predetermined locations (such as having different density of vias at different zones) underneath the copper coin at the $5^{th}$-$40^{th}$ layers of the laminates, such that the heat at the copper coin is able to be efficiently conducted away through the vias. In some embodiments, more than 256,000 vias are formed on one PCB panel.

In some embodiments, copper nanoparticle based solder paste is filled in the through-hole vias by a pushing method, such as using a printer. The printer generates a pushing force squeezing a solution with dispersed nanoparticles into the through-hole on the PCB. In other embodiments, a pull method is used to suck in the solution with the dispersed nanoparticles on the opposite side of the PCB. In some other embodiments, the push and pull methods are used together in sequence or concurrently for filling the through-holes with the dispersed nanoparticles solution. In some embodiments, electroplating is performed before the filling of the copper nanoparticles.

In some embodiments, the aspect ratio of the depth to width of the via is 4:1. In some other embodiments, the aspect ratio of the depth to width of the via is 9:1. Using some embodiments of the present invention, the via holes are able to have a full filling (e.g., 100% filling) or a filling greater than 75%.

In some embodiments, the nanoparticles comprise copper, silver, nickel, indium, aluminum, or a combination thereof. A person of ordinary skill in the art appreciates that any other metals or combinations are able to be used, such as Cu/In and Cu/Ni. In some embodiments, the solution has dispersed nanoparticles having a concentration higher than 80%. In other embodiments, the concentration of the nanoparticles is higher than 90%. In some embodiments, the solvent used to disperse the nanoparticles comprises an organic solvent, an inorganic solvent, or a combination thereof. An exemplary organic solvent is alcohol, such as methanol or ethanol. In some embodiments, the sizes of the nanoparticles are ranging from 1 nm to 10 nm. In some embodiments, the nanoparticles are in different sizes, such that it forms a well packed filling. For examples, a 2 nm nanoparticle is in the gap between two 10 nm nanoparticles forming a well packed structure, such as three nanoparticles are all in contact with each other. In some other embodiments, the size of the nanoparticles is substantially uniform.

In some embodiments, the through holes (via holes) are able to be plugged before filling the nanoparticles, such that the filled nanoparticles do not leak out. The plugging/capping material can be a polymer, an electroplated material, or a combination thereof.

Figure 4:
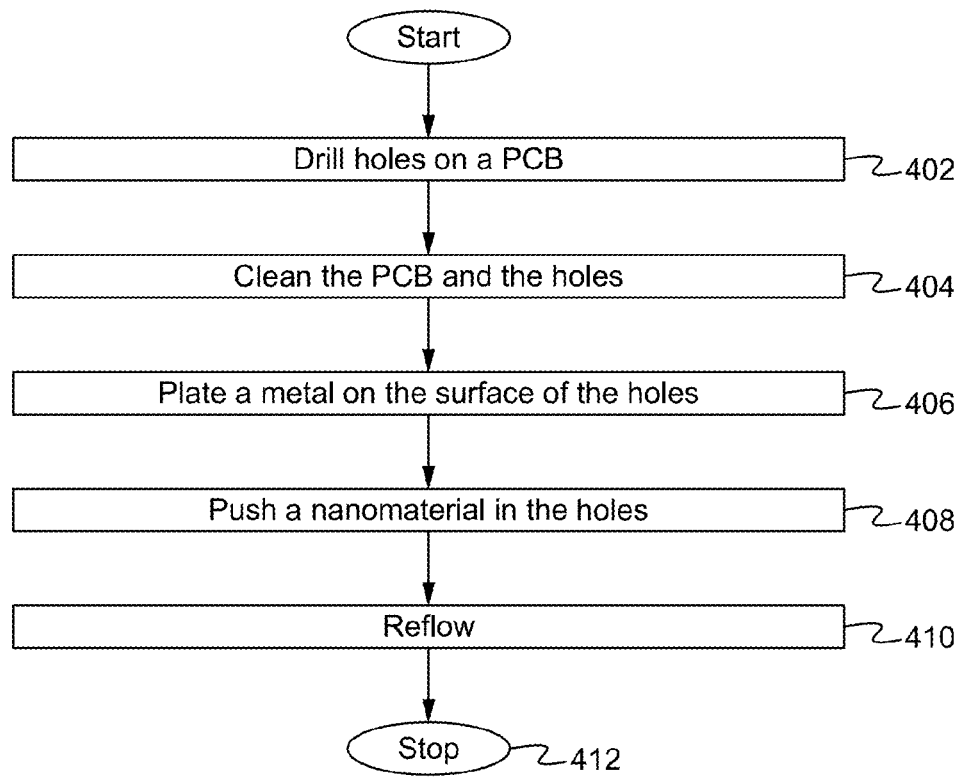
FIG. 4 is a flow chart illustrating a PCB forming method in accordance with some embodiments of the present invention.

FIG. 4 is a flow chart illustrating a PCB forming method 400 in accordance with some embodiments of the present invention. At Step 402, one or more via holes on a PCB board are formed using a mechanical or laser drill. At Step 404, chemical solutions or plasma are used to clean the top, bottom, and sidewalls of the via hole in a desmearing process. At Step 406, the outer surface of a via barrel is metallized using an electroless copper plating solution. An amount of copper is electroplated into the via barrel. At Step 408, a nanocopper solder is pushed into the one or more via holes. At Step 410, reflow is performed by sending the PCB board through a lead-free solder reflow oven to melt or fuse the nano-copper solder. The method 400 can stop at Step 412.

In utilization, a nano-copper solder is used to fill the via holes forming a via with high efficient vertical heat transferring/dissipating path. In operation, holes are drilled on the PCB board, an amount of the nanoparticles are filled inside the holds, and a reflowing process is performed.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A method of forming filled holes on an electronic board comprising:
    a) forming one or more holes on the electronic board;
    b) placing a nanomaterial inside the one or more holes, wherein the nanomaterial comprises a nanomaterial dispersed solution having nanoparticles dispersed in a solvent; and
    c) heating the nanomaterial dispersed solution such that the solvent evaporates and the nanoparticles fuse together thereby forming one or more holes on the electronic board filled with fused nanoparticles.

2. The method of claim 1, wherein the electronic board comprises a printed circuit board.

3. The method of claim 1, wherein the nanomaterial comprises nanocopper.

4. The method of claim 1, wherein the one or more holes comprise a through hole.

5. The method of claim 1, further comprising plating a metal on the one or more holes.

6. The method of claim 1, wherein the solvent comprises an alcohol.

7. The method of claim 1, wherein the placing comprising pushing in the nanomaterial.

8. The method of claim 7, wherein the pushing comprises using a sequeegee.

9. The method of claim 1, wherein the placing comprises using a stencil printer.

10. The method of claim 1, wherein the placing comprises pulling in the nanomaterial.

11. The method of claim 10, wherein the pulling comprises using a vacuum table.

12. An electronic board comprising:
    a. a body having a nanoparticles filled via extending from a first surface of the body to a second surface of the body, wherein the nanoparticles filled via forms a heat conducting path, further wherein the nanoparticles comprise mixed sizes nanoparticles;
    b. a heat generating device coupled to the first surface of the body and thermally connected to the nanoparticles filled via; and
    c. a heat sink coupled to the second surface of the body and thermally connected to the nanoparticles filled via.

13. The board of claim 12, wherein the via comprises a body having nanoparticles in a solution distributed substantially throughout the body.

14. The board of claim 12, wherein the via is enclosed by a capping layer.

15. A method of filling a plated through-hole comprising:
    a) forming a via hole on a PCB board;
    b) cleaning the via hole by using a chemical solution or plasma;
    c) forming a layer of metal coating on an outer surface of the via hole;
    d) placing a nanomaterial solder into the via hole; and
    e) performing a reflow process.

16. The method of claim 15, wherein the via hole is formed by using a mechanical or a laser drill.

17. The method of claim 15, wherein the forming the layer of metal coating uses an electroless copper plating solution.

18. The method of claim 15, further comprising electroplating copper into the via hole.

19. The method of claim 15, wherein the nanomaterial solder comprises a nanocopper solder.

20. The method of claim 15, wherein the placing comprises pushing.

21. The method of claim 15, wherein the placing comprises pulling.

22. The method of claim 15, wherein the reflow comprises sending the PCB board through a lead-free solder reflow oven to melt or fuse the nanomaterial solder.

* * * * *